US008697500B2

(12) United States Patent
Iwata (10) Patent No.: US 8,697,500 B2
(45) Date of Patent: Apr. 15, 2014

(54) METHOD FOR MANUFACTURING SOLID-STATE IMAGE SENSOR

(75) Inventor: Junji Iwata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 98 days.

(21) Appl. No.: 13/276,753

(22) Filed: Oct. 19, 2011

(65) Prior Publication Data

US 2012/0100659 A1 Apr. 26, 2012

(30) Foreign Application Priority Data

Oct. 26, 2010 (JP) ................................. 2010-240104
Oct. 12, 2011 (JP) ................................. 2011-225301

(51) Int. Cl.
*H01L 21/339* (2006.01)
*H01L 21/00* (2006.01)

(52) U.S. Cl.
USPC ............... 438/144; 438/57; 438/60; 257/291; 257/E31.032

(58) Field of Classification Search
USPC ............ 257/232, 291, 292, E27.13, E31.032; 438/48, 57, 237, 60, 144
See application file for complete search history.

(56) References Cited

U.S. PATENT DOCUMENTS

| 5,811,342 A * | 9/1998 | Wu ................................ 438/303 |
| 6,660,553 B2 * | 12/2003 | Kimura et al. .................... 438/48 |
| 6,690,423 B1 * | 2/2004 | Nakamura et al. ............ 348/311 |
| 7,042,061 B2 * | 5/2006 | Nakamura et al. ............ 257/461 |
| 7,663,165 B2 * | 2/2010 | Mouli ........................... 257/215 |
| 2003/0030083 A1 | 2/2003 | Lee et al. |
| 2003/0124864 A1 * | 7/2003 | Komori et al. ................ 438/694 |
| 2004/0108502 A1 * | 6/2004 | Nakamura et al. .............. 257/61 |
| 2005/0023553 A1 * | 2/2005 | Rhodes ......................... 257/162 |
| 2005/0098806 A1 * | 5/2005 | Rhodes ......................... 257/292 |
| 2005/0274988 A1 * | 12/2005 | Hong ............................ 257/225 |
| 2006/0001060 A1 * | 1/2006 | Rhodes ......................... 257/292 |
| 2006/0011919 A1 * | 1/2006 | Mouli ............................. 257/69 |
| 2006/0249766 A1 * | 11/2006 | Rhodes ......................... 257/292 |
| 2011/0136291 A1 | 6/2011 | Iwata et al. |
| 2011/0141328 A1 | 6/2011 | Iwata |

FOREIGN PATENT DOCUMENTS

| JP | 11-274454 A | 10/1999 |
| JP | 2000-012823 A | 1/2000 |
| JP | 2000-031525 A | 1/2000 |
| JP | 2003-264283 A | 9/2003 |
| JP | 2004-273913 A | 9/2004 |
| JP | 2006-073611 A | 3/2006 |

* cited by examiner

*Primary Examiner* — Robert Huber
(74) *Attorney, Agent, or Firm* — Fitzpatrick, Cella, Harper & Scinto

(57) ABSTRACT

A method for manufacturing a solid-state image sensor includes forming a gate electrode structure including a gate electrode on a gate insulating film formed on a semiconductor substrate, and implanting ions into a first region and simultaneously implanting the ions into a second region of the semiconductor substrate via the gate electrode structure and the gate insulating film, wherein the first region is a region where a charge accumulation region is to be formed, and the second region is a region where an extended region that extends from the charge accumulation region to a portion below the gate electrode is to be formed, and a mean projected range of the ions in the step of simultaneously implanting of the ions into the first region and the second region is larger than a sum total of thicknesses of the gate electrode and the gate insulating film.

7 Claims, 6 Drawing Sheets

METHOD FOR MANUFACTURING SOLID-STATE IMAGE SENSOR

BACKGROUND OF THE INVENTION

1. Field of the Invention

The present invention relates to a method for manufacturing a solid-state image sensor.

2. Description of the Related Art

The structure of a transfer path through which a charge is transferred from a charge accumulation region of a photodiode to a floating diffusion is of prime importance for a solid-state image sensor. If especially the transfer path immediately beneath the gate electrode of a transfer MOS transistor is not formed optimally, the charge accumulated in the charge accumulation region remains without being completely transferred to the floating diffusion, thus leading to generation of, for example, a residual image and noise.

Japanese Patent Laid-Open No. 11-274454 describes a technique of obliquely implanting arsenic into a semiconductor substrate using a photoresist and a control electrode as a mask material to form a bypass region. Japanese Patent Laid-Open No. 2000-012823 describes a technique of implanting impurity ions into a silicon substrate using a gate electrode as a mask, forming silicon oxide films on the two side surfaces of the gate electrode, and further implanting impurity ions into the silicon substrate, thereby forming an LDD (Lightly Doped Drain) portion and a diffusion region.

Unfortunately, a method of obliquely implanting ions into a semiconductor substrate, as described in Japanese Patent Laid-Open No. 11-274454, is incompatible with pixel miniaturization because the photoresist produces a greater shadowing effect upon implantation as pixel miniaturization progresses. On the other hand, in the method described in Japanese Patent Laid-Open No. 2000-012823, the resist mask produces no shadowing effect upon implantation. However, the method described in Japanese Patent Laid-Open No. 2000-012823 is intended to form an LDD structure, so the LDD portion and the diffusion region (accumulation region) adjacent to it inevitably have different impurity concentrations. Hence, in transferring a charge from the diffusion region (charge accumulation portion) to the floating diffusion via the LDD portion, the difference in impurity concentration between the LDD portion and the diffusion region may generate a potential barrier, which may hinder the charge from being completely transferred.

SUMMARY OF THE INVENTION

The present invention provides a technique advantageous in pixel miniaturization and/or complete charge transfer.

One of the aspect of the present invention provides a method for manufacturing a solid-state image sensor including a photoelectric converter including a charge accumulation region, a floating diffusion, and a gate electrode for forming a channel for transferring a charge accumulated in the charge accumulation region to the floating diffusion, the method comprising the steps of: forming a gate electrode structure including the gate electrode on a gate insulating film formed on a semiconductor substrate; and implanting ions into a first region and simultaneously implanting the ions into a second region of the semiconductor substrate via the gate electrode structure and the gate insulating film, wherein the first region is a region where the charge accumulation region is to be formed, and the second region is a region where an extended region that extends from the charge accumulation region to a portion below the gate electrode is to be formed, and a mean projected range of the ions in the step of simultaneous implanting of the ions into the first region and the second region is larger than a sum total of thicknesses of the gate electrode and the gate insulating film.

Further features of the present invention will become apparent from the following description of exemplary embodiments with reference to the attached drawings.

DESCRIPTION OF THE EMBODIMENTS

A solid-state image sensor according to the first embodiment of the present invention includes a pixel array formed by arraying a plurality of pixels so as to form a plurality of rows and a plurality of columns. The solid-state image sensor also includes a row selector which selects a row in the pixel array, a column selector which selects a column in the pixel array, and a readout unit which reads a signal from a pixel selected by the row selector and the column selector. Each pixel can include a photoelectric converter including a charge accumulation region, a floating diffusion, and a gate electrode (the gate electrode of a transfer transistor) for forming a channel for transferring a charge accumulated in the charge accumulation region to the floating diffusion. The floating diffusion may be shared by a plurality of pixels. Each pixel or a pixel group formed from a plurality of pixels which share a common floating diffusion can include an output unit which outputs a signal corresponding to the voltage of the floating diffusion. Also, the pixel array may be formed by one-dimensionally arranging a plurality of pixels.

Figure 1:
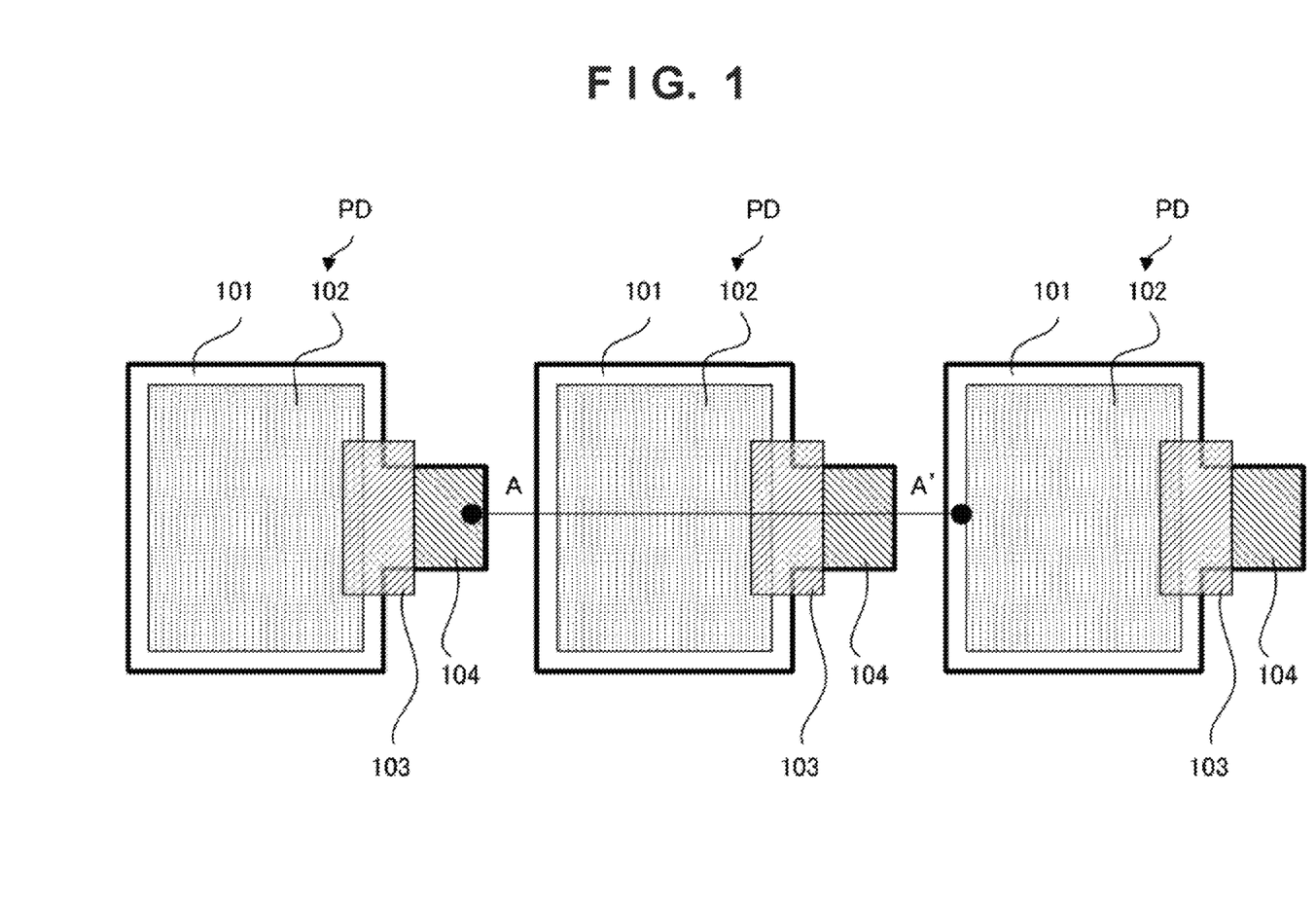
FIG. 1 is a partial plan view of a pixel array in a solid-state image sensor that can be manufactured by a manufacturing method according to the first embodiment of the present invention.
Figure 2:
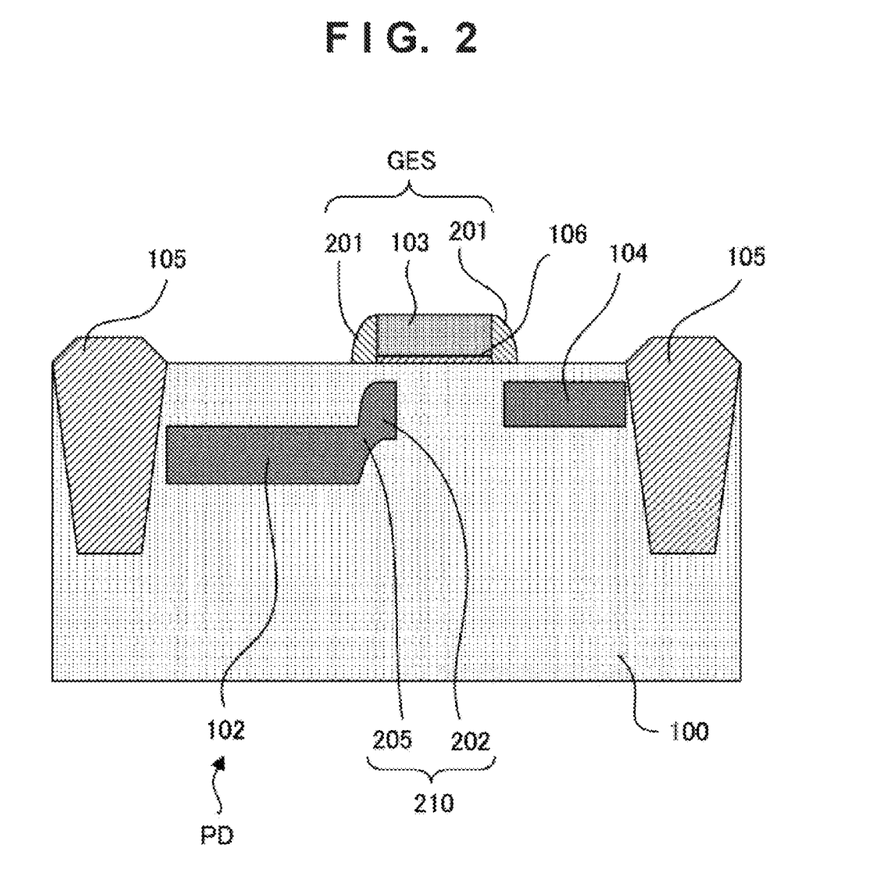
FIG. 2 is a sectional view taken along a line A-A' in FIG. 1.

FIG. 1 is a partial plan view of a pixel array in a solid-state image sensor that can be manufactured by a manufacturing method according to the first embodiment of the present invention. For the sake of simplicity, FIG. 1 shows photoelectric converters PD, floating diffusions 104, and gate electrodes 103 of three pixels. FIG. 2 is a sectional view taken along a line A-A' in FIG. 1. Note that configurations such as interconnection structures, microlenses, and color filters are not shown in FIGS. 1 and 2. Although the following description assumes n type as a first conductivity type, and p type as a second conductivity type, the first conductivity type may be p type and the second conductivity type may be n type.

The solid-state image sensor or its pixel includes the photoelectric converter (photodiode) PD including a charge accumulation region 102, the floating diffusion 104, and the gate electrode 103 for forming a channel via which a charge accumulated in the charge accumulation region 102 is transferred to the floating diffusion 104. The photoelectric converter PD can be formed from, for example, the charge accumulation region 102 of the first conductivity type and a semiconductor region of the second conductivity type (a semiconductor substrate 100 of the second conductivity type in this case). The semiconductor region of the second conductivity type which forms the photoelectric converter PD may be formed by, for example, epitaxial growth or ion implantation on or into a semiconductor substrate of the first conductivity type. The upper surface of the charge accumulation region 102 can be positioned inside the semiconductor substrate 100. Such a charge accumulation region can be called a buried charge accumulation region. A photodiode having a buried charge accumulation region can be called a buried photodiode.

The gate electrode 103 is the gate electrode of a transfer transistor having the charge accumulation region 102 as its source (or drain), and the floating diffusion 104 as its drain (or source). The gate electrode 103 can be formed on a gate insulating film 106 that is formed on the semiconductor substrate 100. The gate electrode 103 serves as the main part of a gate electrode structure GES. The gate electrode structure GES can include not only the gate electrode 103 but also a side wall spacer 201 which covers at least part of a side surface of the gate electrode 103. The side wall spacer 201 can be formed by, for example, forming an insulating film so as to cover the gate electrode 103, and then removing the insulating film except for the portions which cover the side surfaces of the gate electrode 103.

The charge accumulation region 102 and the floating diffusion 104 are formed in an active area 101 on the semiconductor substrate 100. The boundary of the active area 101 is defined by that of an isolation region 105 formed in the semiconductor substrate 100. The isolation region 105 can be made of an oxide formed by the STI (Shallow Trench Isolation) or LOCOS method. Also, the isolation region 105 may have a PN junction isolation structure which uses an impurity diffusion region. An extended region 210 extends from the charge accumulation region 102 to a portion below the gate electrode 103. The charge accumulation region 102 and the extended region 210 form one continuous impurity diffusion region. The charge accumulation region 102 and the extended region 210 have no physical boundary between them. However, for the sake of convenience, a surface including the boundary on the side of the charge accumulation region 102 of the gate electrode structure GES when viewed in a plan view can be regarded as the boundary surface between the charge accumulation region 102 and the extended region 210. The extended region 210 can be regarded as including a hidden region 202 that is a region hidden by the gate electrode 103 when viewed in a plan view, and a connecting region 205 which connects the hidden region 202 and the charge accumulation region 102 to each other. However, the hidden region 202 and the connecting region 205 have no physical boundary between them, either. The hidden region 202 may be in contact with the surface of the semiconductor substrate 100. The hidden region 202 can be used to suppress degradation in transfer efficiency.

A method for manufacturing a solid-state image sensor according to the first embodiment will be described below with reference to FIGS. 3A to 3E. First, in a process shown in FIG. 3A, an isolation region 105 is formed in a semiconductor substrate 100 of the second conductivity type. The semiconductor substrate 100 typically uses a silicon substrate, and the isolation region 105 typically uses silicon oxide. When the isolation region 105 has been formed in the semiconductor substrate 100, an area on the surface of the semiconductor substrate 100, where the semiconductor substrate 100 is absent, serves as an active area 101. In a process shown in FIG. 3B, a gate electrode 103 is formed on a gate insulating film 106 formed on the surface of the semiconductor substrate 100. The gate insulating film 106 and the gate electrode 103 can be formed by forming an insulating film and a gate electrode material film, and then continuously patterning them. Although the gate insulating film 106 is removed in this case, it may remain in the region where a photoelectric converter is to be formed. In a process shown in FIG. 3C, side wall spacers 201 are formed to cover at least parts of the side surfaces of the gate electrode 103 of a transfer transistor. Thus, a gate electrode structure GES including the gate electrode 103 and side wall spacers 201 is formed. The side wall spacers 201 can be formed by, for example, forming an insulating film such as silicon oxide so as to cover the gate electrode 103, and then removing the insulating film except for the portions which cover the side surfaces of the gate electrode 103.

Figure 3A:
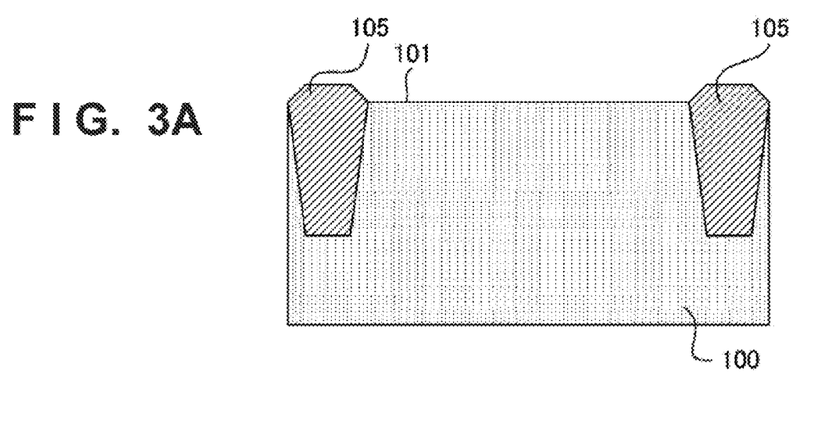
FIGS. 3A to 3E are sectional views showing the method for manufacturing a solid-state image sensor according to the first embodiment.
Figure 3B:
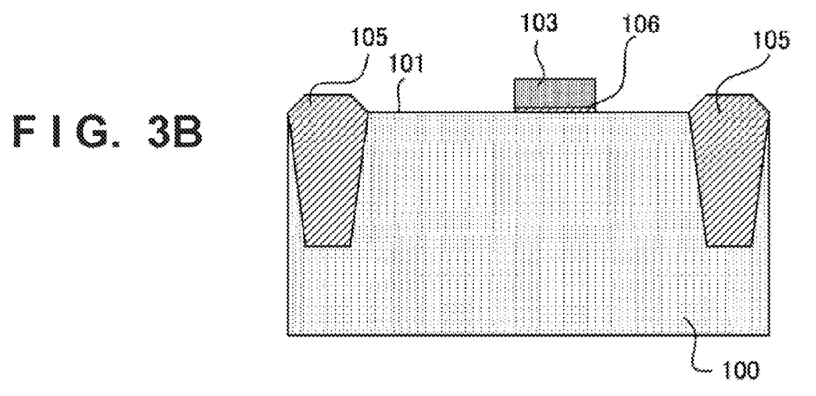
Figure 3C:
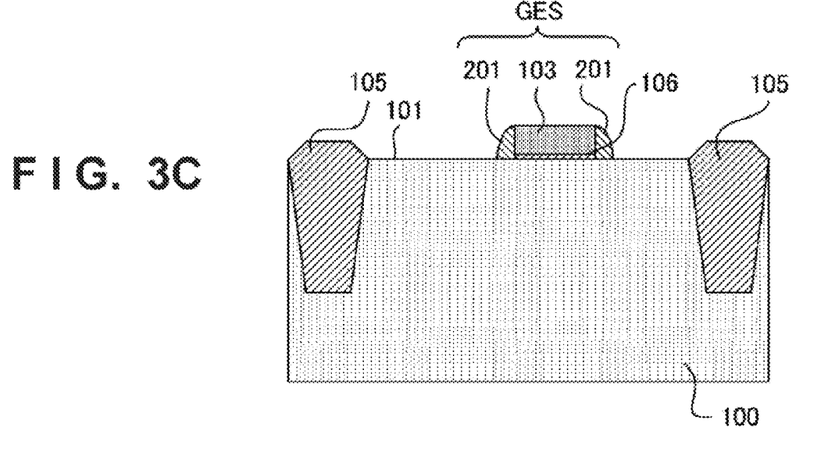
Figure 3D:
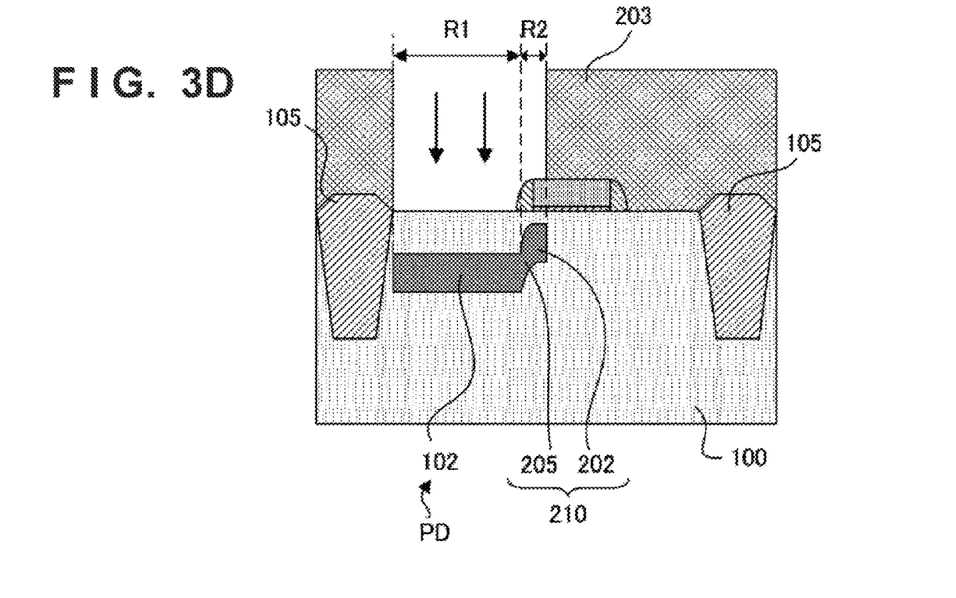

In a process shown in FIG. 3D, ions of the first conductivity type are simultaneously implanted into a first region R1 and second region R2 of the semiconductor substrate 100 via the gate electrode structure GES and the gate insulating film 106. Thus, a continuous impurity diffusion region including a charge accumulation region 102 and extended region 210 is formed. In this ion implantation, a resist pattern 203 having an opening in the first region R1 and second region R2 is used as an ion implantation mask which defines the region where ions are to be implanted into the semiconductor substrate 100. The first region R1 is the region where a charge accumulation region 102 is to be formed, and the second region R2 is the region where an extended region 210 is to be formed so as to extend from the charge accumulation region 102 to a portion below the gate electrode 103. The extended region 210 can be regarded as including a hidden region 202 and connecting region 205, as described earlier. The presence of the side wall spacers 201 makes it possible to smoothen steps formed between the charge accumulation region 102 and the hidden region 202.

The ion acceleration energy in ion implantation shown in FIG. 3D is determined such that the mean projected range of ions becomes larger than the sum total of the thicknesses of the gate electrode 103 and gate insulating film 106. When, for example, the gate electrode 103 has a thickness of 2,000 Å (angstrom), and the charge accumulation region 102 is formed by implanting arsenic into the semiconductor substrate 100, the acceleration energy can be set to 380 KeV or more. Note that the upper limit of the acceleration energy can arbitrarily be determined in accordance with the depth of the charge accumulation region 102 to be formed.

The charge accumulation region 102 is preferably a buried charge accumulation region in order to suppress noise generated by a dark current. On the other hand, the impurity diffusion region (hidden region 202) which forms a transfer path through which a charge is transferred from the charge accumulation region 102 to the floating diffusion 104 preferably has a concentration peak in the vicinity of the surface of the semiconductor substrate 100 in order to facilitate charge transfer. In other words, the preferable peak position, in the depth direction, of the impurity concentration of the charge accumulation region 102 is different from that of the hidden region 202. According to the first embodiment, an impurity diffusion region including two portions with different depths is formed by the same ion implantation process, thus making it possible to stably form an impurity diffusion region having a continuous potential without concern for the adverse effect of a misalignment. In other words, the impurity diffusion region can be arranged such that the peak position of the impurity concentration in the depth direction varies in a continuous curve from the charge accumulation region 102 to the hidden region 202.

The resist pattern 203 serving as a mask used in the process shown in FIG. 3D is a mask which covers the region where a floating diffusion 104 is to be formed, and a portion on the surface of the gate electrode structure GES, which is on the side of the region where the floating diffusion 104 is to be formed. That is, the resist pattern 203 covers regions other than the first region R1 and second region R2. Therefore, no impurity diffusion region which electrically connects the hidden region 202 and the floating diffusion 104 to each other is formed.

Figure 3E:
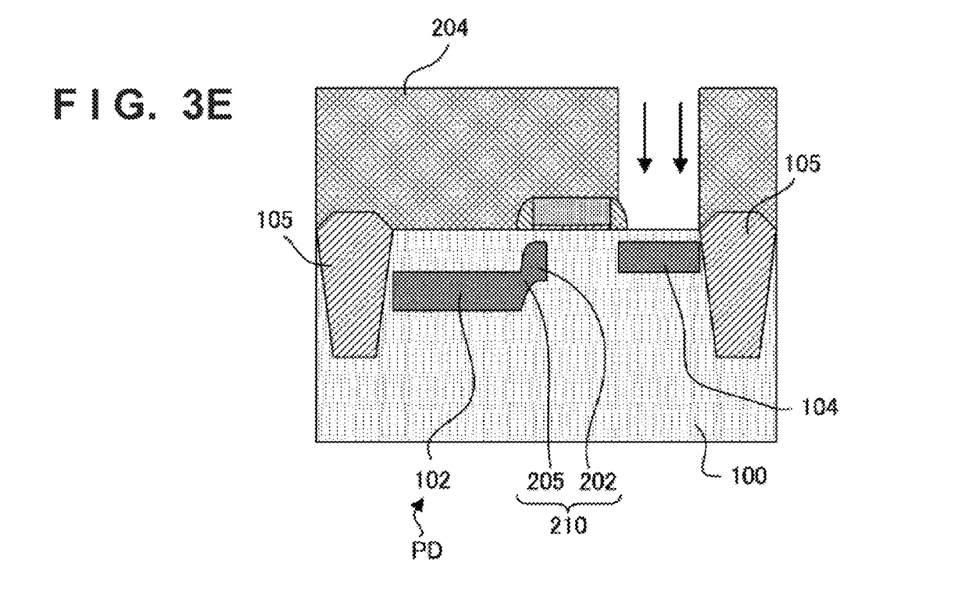

A process shown in FIG. 3E can be performed before or after the process shown in FIG. 3D. In the process shown in FIG. 3E, ions of the first conductivity type are implanted into the region in the semiconductor substrate 100, where a floating diffusion 104 is to be formed, using a resist pattern 204 having an opening in the region where the floating diffusion 104 is to be formed. Thus, a floating diffusion 104 is formed. In the process shown in FIG. 3E, ions are typically implanted into the region in the semiconductor substrate 100, where a floating diffusion 104 is to be formed, with an acceleration energy lower than that used in the process shown in FIG. 3D (that is, the process of implanting ions into the first region R1 and the second region R2). This is because the floating diffusion 104 is typically formed near the surface of the semiconductor substrate 100. Examples of the ion implantation conditions can include an ion type of As (arsenic), an acceleration energy of 80 KeV, and a dose of $3 \times 10^{13}$ (cm$^{-2}$). After the process shown in FIG. 3E, the resist pattern 204 is removed to obtain the configuration schematically shown in FIG. 2.

In forming the side wall spacers 201 on the side surfaces of the gate electrode 103 of a transfer transistor, side wall spacers can simultaneously be formed on the gate electrodes of other transistors in each pixel and those of transistors in other circuits outside this pixel (for example, a row selection circuit, a column selection circuit, and a readout circuit). The thus formed side wall spacers can be utilized to form transistors having an LDD structure. The LDD structure is advantageous in increasing the breakdown voltage of a transistor. A region having a relatively low impurity concentration in the floating diffusion 104 which forms an LDD (Lightly Doped Drain) structure can be formed in, for example, the following way. That is, it is only necessary to, after the gate electrode 103 is formed in the process shown in FIG. 3B, form a resist pattern having an opening only in the region where a floating diffusion 104 is to be formed, and implant ions into the semiconductor substrate 100 via the opening. At this time, ion implantation is performed at a dose smaller than that used in the process shown in FIG. 3E.

Since it is not indispensable for the method according to the first embodiment to tilt the direction, in which ions are implanted, with respect to a normal to the surface of the semiconductor substrate 100, this method is advantageous in pixel miniaturization. Note that a method of tilting the direction, in which ions are implanted, with respect to a normal to the surface of the semiconductor substrate, as described in Japanese Patent Laid-Open No. 11-274454, may suffer a greater shadowing effect upon implantation as pixel miniaturization progresses, as described earlier.

Also, the use of the method according to the first embodiment makes it possible to form the charge accumulation region 102 and the extended region 210 by the same ion implantation process, thus uniforming the impurity concentration of the impurity diffusion region including the charge accumulation region 102 and extended region 210. Therefore, no potential barrier is formed in the path extending from the charge accumulation region 102 to the hidden region 202 of the extended region 210. This is advantageous in completely transferring the charge in the charge accumulation region 102 to the floating diffusion 104.

The side wall spacers 201 may be formed using silicon oxide, as described above, but may also be formed using silicon nitride. A method of using silicon nitride to form the side wall spacers 201 of a transfer transistor and the side wall spacers of other transistors is advantageous in forming a source and/or drain of a transistor by the SAC (an abbreviation for Self Alignment Contact) technique. Practical application of the SAC technique is advantageous in advancing micropatterning of transistors. This leads to a speedup and chip downsizing. Therefore, it is possible to provide a compact, expensive solid-state image sensor capable of high-speed image capture.

In the first embodiment, the cross-sectional structure of an impurity diffusion region including a charge accumulation region and extended region is controlled by utilizing side wall spacers. In the second embodiment, the cross-sectional structure of an impurity diffusion region including a charge accumulation region and extended region is controlled without utilizing side wall spacers. That is, in the second embodiment, ions of the first conductivity type are simultaneously implanted into a first region R1 and second region R2 of a semiconductor substrate 100 via a gate insulating film 106 and a gate electrode structure GES having no side wall spacers.

Figure 4:
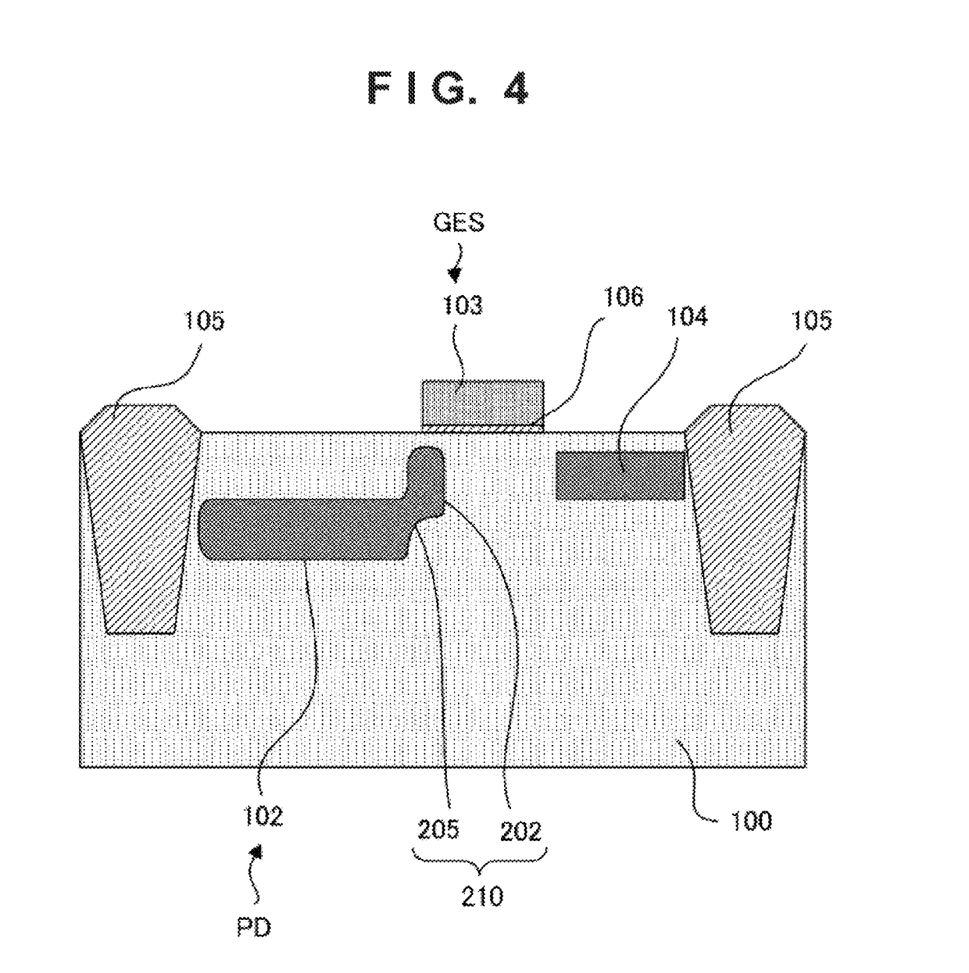
FIG. 4 is a partial plan view of a pixel array in a solid-state image sensor that can be manufactured by a manufacturing method according to the second embodiment of the present invention.

FIG. 4 is a partial plan view of a pixel array in a solid-state image sensor that can be manufactured by a manufacturing method according to the second embodiment of the present invention. In the second embodiment, the penetration depth (distribution) of ions implanted into the semiconductor substrate 100 is utilized to allow a charge accumulation region 102 and an extended region 210 to smoothly continuous with each other. The charge accumulation region 102 and the extended region 210 can moreover be allowed to smoothly continuous with each other by thermal diffusion after ion implantation.

When the penetration depth (distribution) of ions implanted into the semiconductor substrate 100 is used, d<2ΔRp, for example, is preferably satisfied, where d is the thickness of a gate electrode 103 of a transfer transistor, and ΔRp is the penetration depth of the implanted ions. When the charge accumulation region 102 and the extended region 210 are allowed to be smoothly continuous with each other by thermal diffusion, d<2√Dt, for example, is preferably satisfied, where √Dt is the amount of thermal diffusion. Note that D is the diffusion coefficient, and t is the thermal diffusion time. Both d<2ΔRp and d<2√Dt may be satisfied, as a matter of course.

A method for manufacturing a solid-state image sensor according to the third embodiment will be described with reference to FIGS. 5A to 5D. FIGS. 5A to 5D are sectional views taken along the line A-A' in FIG. 1, like FIGS. 3A to 3E. The method for manufacturing a solid-state image sensor according to the third embodiment is continuous with the processes described with reference to FIGS. 3A and 3B in the first embodiment.

Figure 5A:
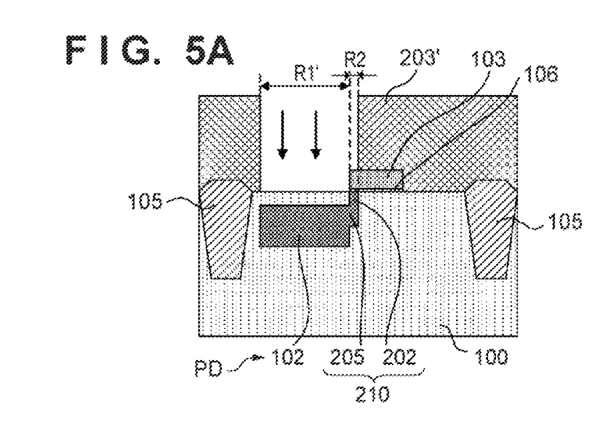
FIGS. 5A to 5D are sectional views showing a method for manufacturing a solid-state image sensor according to the third embodiment.

In a process shown in FIG. 5A, ions of the first conductivity type are simultaneously implanted into a first region R1' and second region R2 of a semiconductor substrate 100 via a gate electrode 103 and a gate insulating film 106. Thus, an impurity diffusion region including a charge accumulation region 102 and extended region 210 is formed. This process corresponds to that shown in FIG. 3D of the first embodiment, and a detailed description of the same parts as in the process shown in FIG. 3D of the first embodiment will not be given.

Referring to FIG. 5A, not providing the side wall spacers 201 shown in FIG. 3D makes it possible to alleviate damage inflicted on a photoelectric converter PD upon etching in the process of forming side wall spacers. Referring again to FIG. 5A, a resist pattern 203' extends from the region where an isolation region 105 is present toward the gate electrode 103, and the first region R1' has a range narrower than that shown in the first region R1 of FIG. 3D.

Figure 5B:
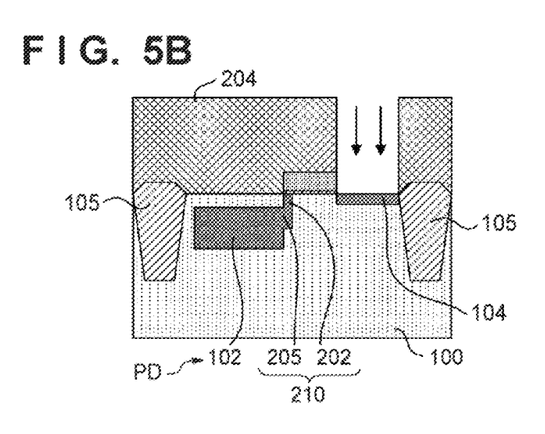

A process shown in FIG. 5B is performed next. In the process shown in FIG. 5B, a floating diffusion 104 is formed. This process corresponds to that shown in FIG. 3E of the first embodiment, and a detailed description of the same parts as in the process shown in FIG. 3E of the first embodiment will not be given. The floating diffusion 104 can be formed simultaneously with a region where the sources and drains of transistors in other circuits outside each pixel are formed. This region formed simultaneously with the floating diffusion 104 can be a region (LDD region) where the source and drain of the completed transistor have low impurity concentrations.

Figure 5C:
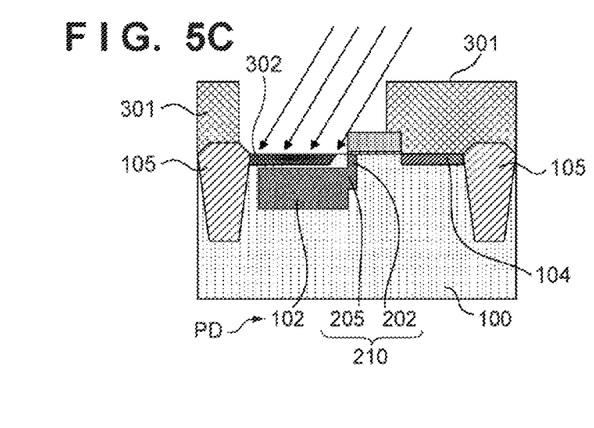

In a process shown in FIG. 5C, ions of the second conductivity type are implanted into at least part of a region above the charge accumulation region 102 or at least part of an upper region in the charge accumulation region 102, using a resist pattern 301 having an opening from which at least part of the charge accumulation region 102 formed in the process shown in FIG. 5A is exposed. In other words, in the process shown in FIG. 5C, ions of the second conductivity type are implanted into the first region R1 of the semiconductor substrate 100. With this process, a surface region 302 of the second conductivity type is formed to cover at least part of the charge accumulation region 102. The surface region 302 is preferably formed to cover the entire surface of the charge accumulation region 102. The surface region 302 can suppress flow of a dark current generated on the surface of the semiconductor substrate 100 into the charge accumulation region 102. Note that when part of the extended region 210 is positioned near the surface of the semiconductor substrate 100, on which the gate electrode 103 is not arranged, the surface region 302 may cover the part of the extended region 210.

Figure 5D:
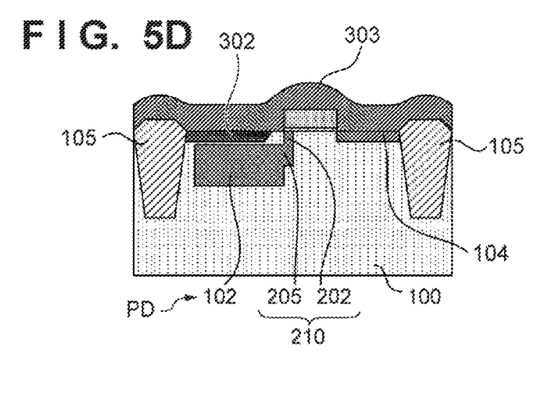

In a process shown in FIG. 5D, an insulating film 303 is formed on the entire surface of each pixel so as to cover the photoelectric converter PD, a gate electrode structure GES, and the floating diffusion 104. The insulating film 303 may be, for example, a silicon nitride film or have a structure in which a silicon nitride film and a silicon oxide film or silicon oxynitride film, for example, are stacked. The insulating film 303 protects the photoelectric converter PD. The insulating film 303 can also function as an antireflection coating. The insulating film 303 may extend across a plurality of pixels. After that, an interlayer dielectric film, contacts, and interconnections, for example, are formed to complete a solid-state image sensor.

Note that insulating film 303 can be used to form side wall spacers on the gate electrodes of transistors in other circuits outside each pixel (for example, a row selection circuit, a column selection circuit, and a readout circuit). After a film to serve as the insulating film 303 is formed, etching is performed using a resist pattern which covers each pixel, thereby making it possible to form side wall spacers in other circuits outside this pixel.

Since it is not indispensable for the method according to the third embodiment to tilt the direction, in which ions are implanted, with respect to a normal to the surface of the semiconductor substrate 100 either, this method is advantageous in pixel miniaturization. Also, as the impurity concentration of the impurity diffusion region including the charge accumulation region 102 and extended region 210 can be uniformed in the third embodiment as well, a potential barrier is less likely to be formed in the path extending from the charge accumulation region 102 to a hidden region 202 of the extended region 210.

A solid-state image sensor according to the present invention is not limited to the above-described embodiments. For example, the charge accumulation region of the first conductivity type on the photoelectric converter PD may be arranged in an epitaxial layer of the first conductivity type, a semiconductor region of the second type may further be arranged on the upper surface of the charge accumulation region, or the conductivity type of each semiconductor region may be reversed. Also, the above-described embodiments can be combined as needed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2010-240104 filed Oct. 26, 2010 and 2011-225301 filed Oct. 12, 2011, which are hereby incorporated by reference herein in their entirety.

What is claimed is:

1. A method for manufacturing a solid-state image sensor including a photoelectric converter having a charge accumulation region, a floating diffusion, and a gate electrode for forming a channel for transferring a charge accumulated in the charge accumulation region to the floating diffusion, the method comprising:

forming the gate electrode on a gate insulating film formed on a semiconductor substrate;

implanting, after the forming of the gate electrode, ions into a region where the floating diffusion is to be formed;

forming, after the implantation of the ions into the region where the floating diffusion is to be formed, side wall spacers each covering one of side surfaces of the gate electrode such that a gate electrode structure including the gate electrode and the side wall spacers is formed;

simultaneously implanting ions into a first region and a second region of the semiconductor substrate, wherein the first region is a region where the charge accumulation region is to be formed, the second region is a region where an extended region that extends from the charge accumulation region to a portion below the gate electrode is to be formed, and the ions are implanted, via the gate insulating film and the gate electrode structure including the gate electrode and one of the side wall spacers, into the second region of the semiconductor substrate; and implanting, after the forming of the side wall spacers, ions into the region where the floating diffusion is to be formed such that the floating diffusion with an LDD structure is formed using another of the side wall spacers, wherein a mean projected range of the ions in the step of simultaneous implanting of the ions into the first region and the second region is larger than a sum total of thicknesses of the gate electrode and the gate insulating film.

2. The method according to claim 1, wherein the simultaneous implanting of the ions into the first region and the second region is performed using a mask which covers a region where the floating diffusion is to be formed, and a portion on a surface of the gate electrode structure, which is on a side of the region where the floating diffusion is to be formed.

3. The method according to claim 1, further comprising implanting ions into a region in the semiconductor substrate, where the floating diffusion is to be formed, with an acceleration energy lower than an acceleration energy used in the simultaneous implanting of the ions into the first region and the second region.

4. The method according to claim 1, wherein an upper surface of the charge accumulation region is positioned inside the semiconductor substrate.

5. The method according to claim 1, further comprising:
   implanting ions into a region in the semiconductor substrate, where the floating diffusion is to be formed, with an acceleration energy lower than an acceleration energy used in implanting the ions into the first region and the second region; and
   forming an insulating film covering the first region and the second region of the semiconductor substrate, and the region where the floating diffusion is to be formed, after the step of simultaneous implanting of the ions into the first region and the second region of the semiconductor substrate via the gate electrode structure and the gate insulating film, and the step of implanting the ions into the region where the floating diffusion is to be formed.

6. The method according to claim 5, further comprising implanting ions of a second conductivity type into at least part of the first region after the simultaneously implanting of the ions into the first region and the second region.

7. The method according to claim 1, wherein each of the side wall spacers has a shape that is convex.

* * * * *